(12) United States Patent
Cheng

(10) Patent No.: US 7,810,018 B2
(45) Date of Patent: Oct. 5, 2010

(54) SLIDING WINDOW METHOD AND APPARATUS FOR SOFT INPUT/SOFT OUTPUT PROCESSING

(75) Inventor: Jung-Fu Cheng, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1013 days.

(21) Appl. No.: 11/553,767

(22) Filed: Oct. 27, 2006

(65) Prior Publication Data

US 2008/0104488 A1   May 1, 2008

(51) Int. Cl.
*H03M 13/03* (2006.01)
(52) U.S. Cl. .................................................. 714/794
(58) Field of Classification Search .............. 714/755, 714/786, 794–795; 375/341
See application file for complete search history.

(56) References Cited

U.S. PATENT DOCUMENTS

| 5,446,747 | A | 8/1995 | Berrou |
| 7,200,799 | B2 | 4/2007 | Wang et al. |
| 7,333,581 | B2 * | 2/2008 | Charpentier ............... 375/372 |
| 7,500,169 | B2 * | 3/2009 | Lin ............................. 714/755 |
| 2001/0044919 | A1 | 11/2001 | Edmonston et al. |

FOREIGN PATENT DOCUMENTS

| GB | 2365290 A | 2/2002 |
| WO | 0207453 A2 | 1/2002 |

OTHER PUBLICATIONS

Anderson, John B. et al. "Tailbiting Map Decoders." IEEE Journal on Selected Areas in Communications, vol. 16, No. 2, Feb. 1998, pp. 297-302.
Bahl, L. R. et al. "Optimal Decoding of Linear Codes for Minimizing Symbol Error Rate." IEEE Transactions on Information Theory, vol. IT-20, Mar. 1974, pp. 248-287.
Benedetto, S. et al. "Soft-Output Decoding Algorithms for Continuous Decoding of Parallel Concentrated Convolutional Codes." Proceedings of 1996 IEEE International Conference, Jun. 23-27, 1996, pp. 112-117.

(Continued)

*Primary Examiner*—Shelly A Chase
(74) *Attorney, Agent, or Firm*—Coats & Bennett, P.L.L.C.

(57) ABSTRACT

In one or more embodiments, a method of processing a soft value sequence according to an iterative soft-input-soft-output (SISO) algorithm comprises carrying out sliding-window processing of the soft value sequence in a first iteration using first window placements and in a second iteration using second window placements, and varying the window placements between the first and second iterations. In at least one embodiment, a communication receiver circuit is configured to carry out iterative SISO processing, wherein it processes a soft value sequence using sliding windows, and wherein it varies window placements between one or more iterations. The communication receiver circuit comprises, for example, all or part of a turbo decoding circuit or other type of iterative block decoding circuit, an equalization and decoding circuit, a soft demodulation and decoding circuit, a multi-user detection and decoding circuit, or a multiple-input-multiple-output detection and decoding circuit.

29 Claims, 17 Drawing Sheets

OTHER PUBLICATIONS

Benedetto, S. et al. "A Soft-Input Soft-Output Maximum A Posteriori (MAP) Module to Decode Parallel and Serial Concatenated Codes." JPL TDA Progress Report, California Institute of Technology, Nov. 1996, pp. 1-20.

Benedetto, S. et al. "Serial Concatenation of Interleaved Codes: Performance Analysis, Design, and Iterative Decoding." IEEE Transactions on Information Theory, vol. 44, No. 3, May 1998, pp. 909-926.

Berrou, Claude et al. "Near Shannon Limit Error—Correcting Coding and Decoding: Turbo-Codes (1)." Proceedings of 1993 IEEE International Conference, May 1993, pp. 1064-1070.

Forney, Jr., G. David. "The Viterbi Algorithm." Proceedings of the IEEE, vol. 61, No. 3, Mar. 1973, pp. 268-278.

Moher, Michael et al. "An Iterative Algorithm for Asynchronous Coded Multiuser Detection." IEEE Communications Letters, vol. 2, No. 8, Aug. 1998, pp. 229-231.

Narayanan, Krishna R. et al. "A Serial Concatenation Approach to Iterative Demodulation and Decoding." IEEE Transactions on Communications, vol. 47, No. 7, Jul. 1999, pp. 956-961.

Picart, Annie et al. "Turbo-Detection: a New Approach to Combat Channel Frequency Selectivity." Proceedings of 1997 IEEE International Conference, 1997, pp. 1498-1502.

Tonello, Andrea M. "Space-Time Bit-Interleaved Coded Modulation with an Iterative Decoding Strategy." Proceedings of IEEE Vehicle Technology Conference, Sep. 2000, pp. 473-478.

Viterbi, Andrew J. "An Intuitive Justification and a Simplified Implementation of the Map Decoder for Convolutional Codes." IEEE Journal on Selected Areas in Communications, vol. 16, No. 2, Feb. 1998, pp. 260-264.

* cited by examiner

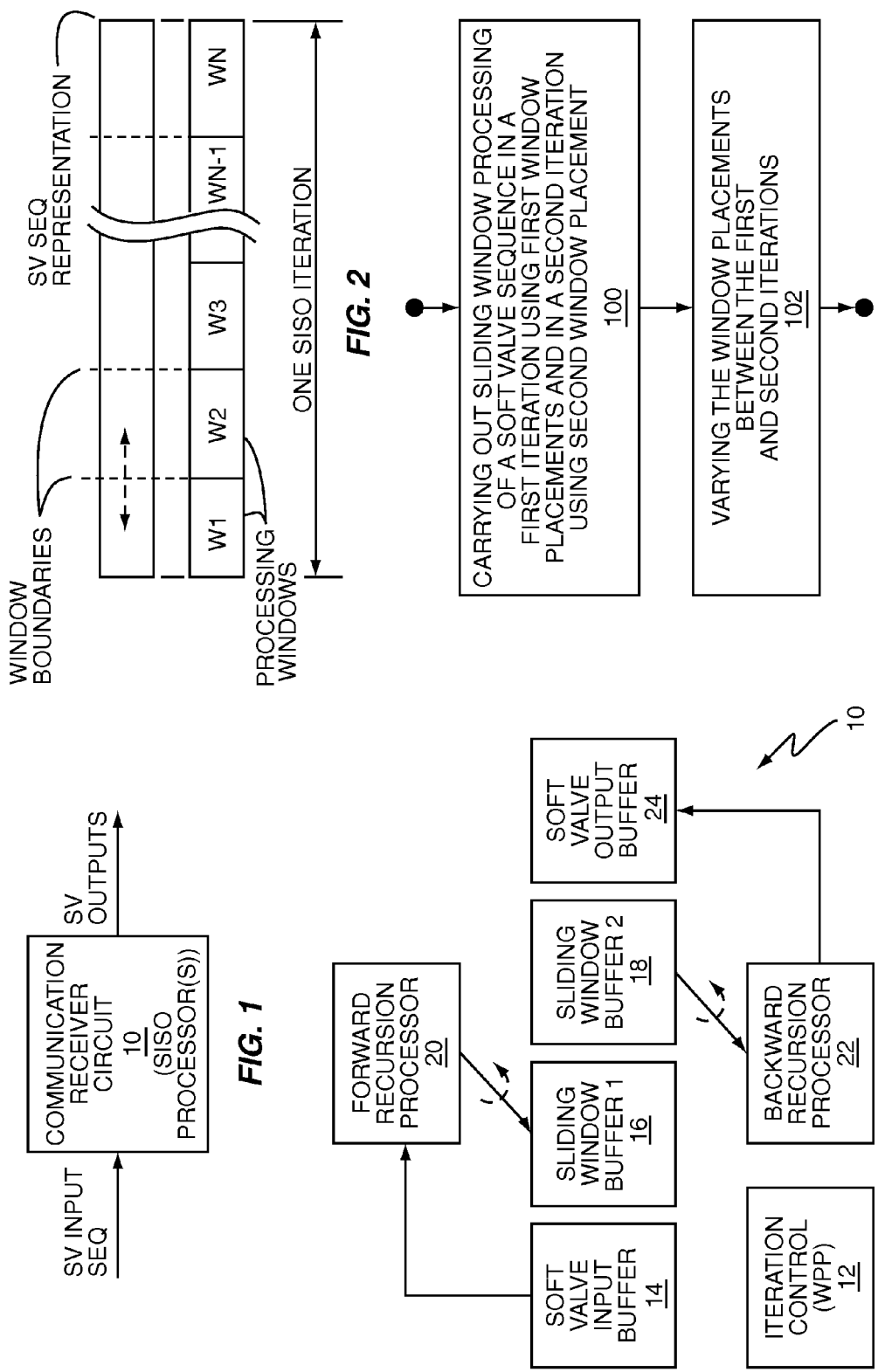

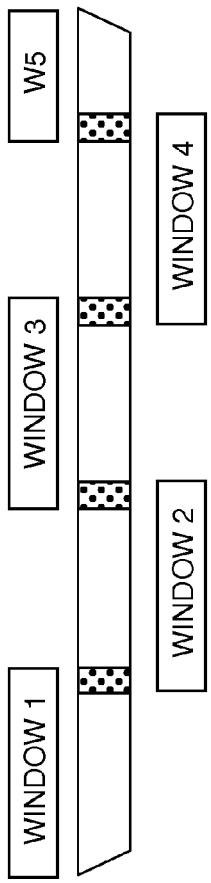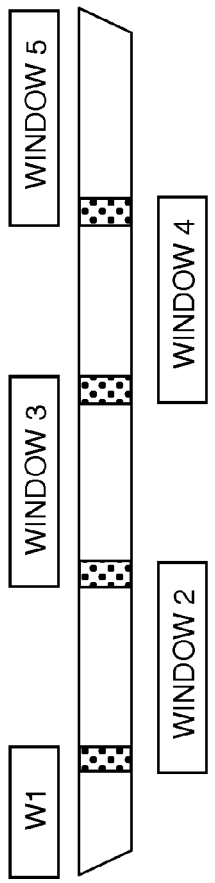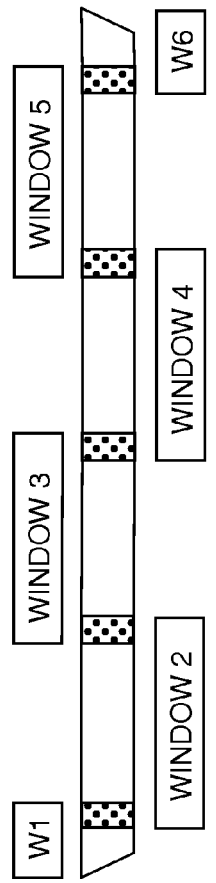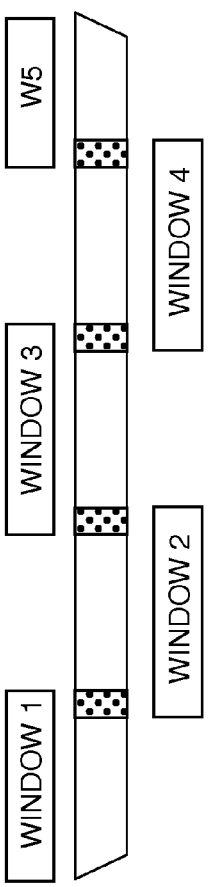

SLIDING WINDOW METHOD AND APPARATUS FOR SOFT INPUT/SOFT OUTPUT PROCESSING

BACKGROUND

The present invention generally relates to soft input/soft output algorithms, many varieties of which are used in communication signal processing, and particularly relates to the use of sliding windows in soft input/soft output processing.

As the term implies, soft input/soft output (SISO) algorithms receive soft values as inputs, and produce corresponding soft values as outputs. Maximum a posteriori (MAP) processing is one example of a SISO algorithm, and finds widespread use in many signal-processing applications, such as in decoding turbo codes, which are built from the concatenation of two or more relatively simple convolutional codes.

In more detail, Turbo coding encodes a desired information sequence, also referred to as the "systematic" sequence, using two or more convolutional encoders. The resulting coded output includes the outputs of each convolutional encoder, along with the systematic sequence. Because the original information sequence is part of the coded output, turbo codes represent a type of "systematic" code.

In one approach to decoding turbo codes, a MAP decoder receives a sequence of bit soft values, e.g., probability distributions or Log-Likelihood-Ratios (LLRs), representing a turbo encoded sequence of bits. In turn, the MAP decoder improves the ability to make subsequent "hard" decisions on the systematic bit soft values by forming better and better estimates of the corresponding a posteriori probabilities of the systematic bits based on knowledge of the coding structure.

The so-called "BCJR" algorithm represents a popular implementation of the MAP algorithm for turbo decoding, and gains processing advantages by exploiting the trellis structure of convolutional codes. Assuming an input sequence of LLRs corresponding to coded bits and systematic bits in a turbo coded sequence, the BCJR algorithm refines the LLRs of the systematic bits based on its determination of forward and backward state metrics and branch metrics for each systematic bit. In turn, those determinations rely on knowledge of the trellis structure and on the input soft values of the systematic and parity bits.

In one approach to improving BCJR and other trellis-based decoding, encoded sequences include known starting and/or ending values. Adding known values to the beginning and end of an encoded sequence allows the corresponding decoder to begin and end trellis traversal with known starting and ending states, which improves the reliability of the output probability estimates. However, fully traversing the trellis from the known starting values to the known ending values in one sweep, sometimes referred to as "full frame" processing or traversal, imposes significant memory requirements, given potentially long trellis lengths and the need to accumulate state metrics throughout.

One approach to reducing memory requirements involves subdividing the trellis into a number of windows, and then processing each window separately. This approach, which may be referred to as "sliding window" traversal or processing, accumulates state metrics only over the length of each window, which generally is substantially less than the length of the overall trellis. However, with forward and backward recursion in each window, recursion starts "cold" at an unknown state, at least within the intermediate windows lying between the first and last windows subdividing the trellis. These unknown starting states result in poor reliability of the output soft values, at least until the algorithm "warms up" by accumulating state metrics over a number of stages within the window. These lower reliabilities generally translate into lower decoder performance, resulting in reduced communication link performance. The possibility for the recursions to warm up from unknown starting (or ending) states also forms the practical basis of decoding a tail-biting trellis, where the path corresponding to the true information sequence starts and ends in the same state.

The sliding windows can be overlapped to mitigate this reliability problem, with more overlap generally translating into greater mitigation. However, because the trellis stages within the overlap regions are processed in each one of two overlapping windows, more overlap disadvantageously translates into lower decoder throughput. Besides, even large overlap does not satisfactorily alleviate the reliability problem at the higher data rates afforded by Wideband CDMA (W-CDMA) and other developing wireless communication standards.

More broadly, memory concerns come into play with SISO-based processing of potentially lengthy soft value sequences, whether or not the SISO algorithm uses trellis-based processing. Thus, it is common practice to use sliding window traversal in processing the overall sequence—i.e., the overall sequence is subdivided using a series of overlapped windows. As such, the above-mentioned reliability concerns come into play across a broad range of SISO algorithms wherein windowed traversal is used.

SUMMARY

Subdividing Maximum a posterior (MAP) and other types of soft-input-soft-output (SISO) algorithm processing into individual processing windows lessens processing memory requirements but can result in relatively poor reliability of the output soft values estimated for input sequence positions at or near the processing window boundaries, even where window overlap is used. With fixed window placements, these regions of relatively poor output soft value reliability remain fixed from iteration to iteration of the SISO algorithm. Thus, a method and apparatus as taught herein generate output soft values from a sequence of input soft values in a SISO algorithm by, in each of two or more iterations of the SISO algorithm, subdividing the sequence into a plurality of windows and processing the input soft values in each window, and varying window placements between iterations. Varying window placements between iterations shifts window boundaries relative to the sequence.

In one embodiment, a method of processing a soft value sequence according to an iterative soft-input-soft-output (SISO) algorithm comprises carrying out sliding-window processing of the soft value sequence in a first iteration using first window placements and in a second iteration using second window placements, and varying the window placements between the first and second iterations. Varying the window placements between iterations shifts window boundaries relative to the sequence such that output soft values having relatively poor reliability attributes in one iteration have improved reliability attributes in a next iteration.

As a non-limiting example, the SISO algorithm may be a MAP algorithm used in decoding turbo codes. However, the teachings herein broadly apply to generating output soft values from a sequence of input soft values in SISO algorithm by, in each of two or more iterations of the SISO algorithm, subdividing the sequence into a plurality of windows and processing the input soft values in each window, and varying window placements between iterations to shift window boundaries relative to the sequence. In one embodiment, varying window placements between iterations to shift window boundaries relative to the sequence comprises changing one or more window sizes and/or changing one or more offset values used to place the plurality of windows.

One embodiment of a communication receiver circuit, which may be included in a wireless communication device, is configured to use varying window placements in sliding-window based SISO processing. The communication receiver circuit comprises one or more processing circuits configured to generate output soft values from a sequence of input soft values in a soft-input-soft-output (SISO) algorithm. In each of two or more iterations of the SISO algorithm, the communication receiver circuit subdivides the sequence into a plurality of windows and processes the input soft values in each window, wherein the one or more processing circuits vary window placements between iterations to shift window boundaries relative to the sequence.

In at least one such embodiment, the communication receiver circuit processes the soft values in each window based on performing forward and backward recursion. For example, in a turbo decoder embodiment comprising at least first and second communicatively coupled decoders, one or both such decoders perform sliding-window processing in each decoding iteration.

Of course, the present invention is not limited to the above features and advantages. Indeed, those skilled in the art will recognize additional features and advantages upon reading the following detailed description, and upon viewing the accompanying drawings.

BRIEF DESCRIPTION OF THE DRAWINGS

FIG. 1 is a block diagram of one embodiment of a communication receiver circuit configured to carry out soft-input-soft-output (SISO) processing using sliding window placements that vary between SISO processing iterations.

FIG. 2 is a diagram of one embodiment of processing a sequence of input soft values in an iterative SISO algorithm using varying window placements between iterations.

FIG. 3 is a block diagram of functional circuits in one embodiment of the communication receiver circuit of FIG. 1.

FIG. 4 is a logic flow diagram of one embodiment of processing logic to vary sliding window placements between SISO algorithm iterations.

FIGS. 9-12 are diagrams illustrating one embodiment of changing sliding window placements between a number of trellis traversal iterations using sliding windows.

FIGS. 16, 17, 19, 20, 22, and 23 are diagrams of turbo decoding performance achieved by varying sliding window placements between decoding iterations, while

DETAILED DESCRIPTION

Figure 5:
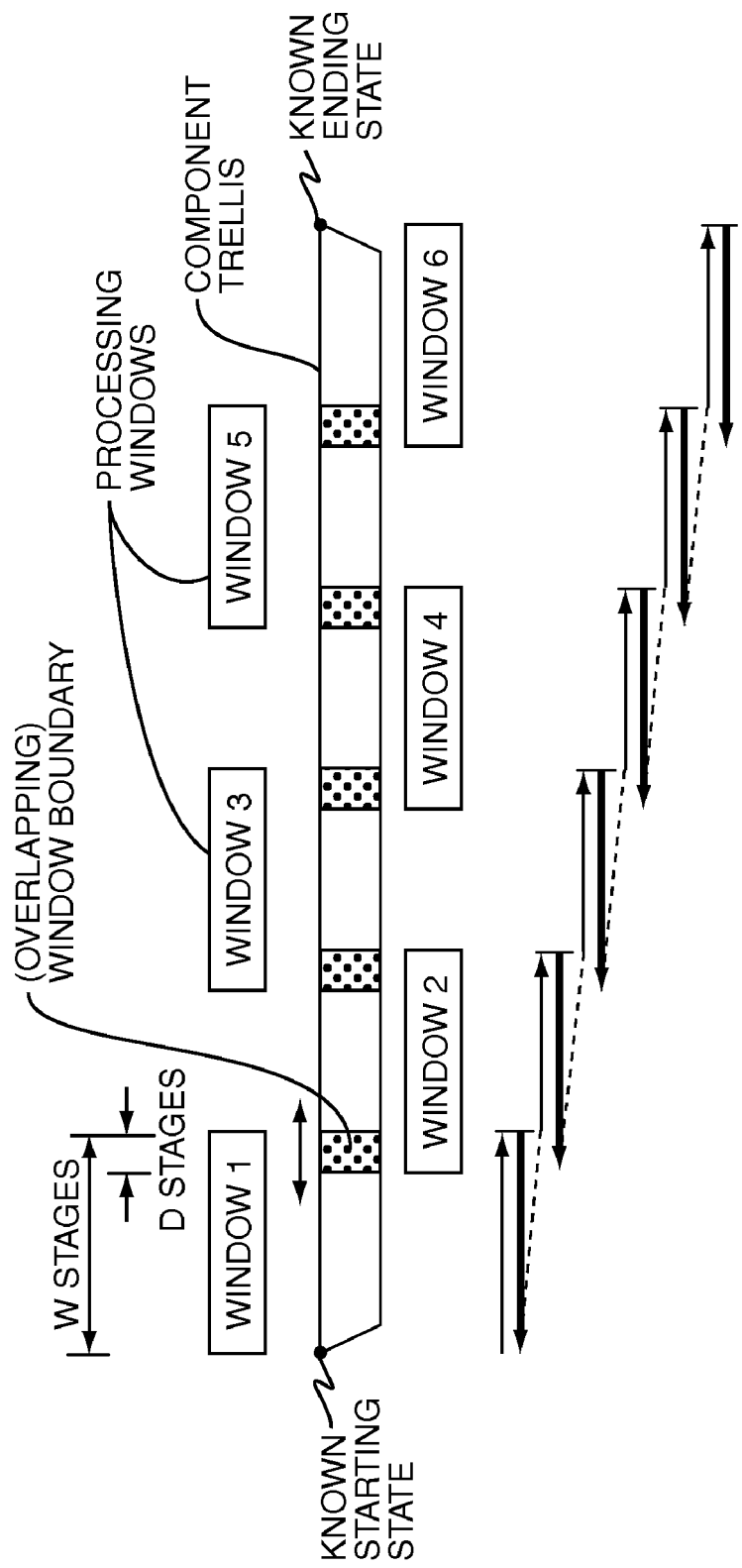
FIGS. 5 and 6 are diagrams of sliding window placements relative to a component trellis used to process a sequence of input soft values.

FIG. 1 illustrates a communication receiver circuit 10 that, in one or more embodiments, implements a method of generating output soft values from a sequence of input soft values in a soft-input-soft-output (SISO) algorithm. More particularly, the communication receiver circuit 10, which is implemented in hardware, software, or any combination thereof, performs iterative SISO processing using sliding-window traversal of the soft value input sequence wherein the sliding window placements vary between one or more iterations.

Referring to FIG. 2, the method in at least one such embodiment comprises, in each of two or more iterations of the SISO algorithm, subdividing the sequence into a plurality of windows (Windows W1-WN) and processing the input soft values in each window, and varying window placements between iterations to shift window boundaries relative to the sequence. One sees that each illustrated processing window corresponds to, or "covers," a subset of soft values in the input sequence, and fully traversing the input sequence—viewed as one iteration of the SISO algorithm—comprises carrying out SISO processing in each window. Note, too, that some embodiments use overlapping window placements, while other embodiments do not. The teachings herein regarding varying window placements between iterations of the SISO algorithm apply to both overlapping and non-overlapping sliding window processing.

In general, with or without the use of window overlap, the sliding window approach to SISO processing reduces state memory requirements as the communication receiver circuit 10 need only accumulate one window's worth of state metrics at a time. At the same time, varying window placements between iterations shifts the window boundaries relative to the input sequence. As will be explained later herein, because the reliability of output soft values generated from input soft values in the vicinity of the window boundaries is relatively poor, shifting the window boundaries relative to the input sequence between iterations insures that the regions of potentially poor algorithm performance change between iterations. Changing those regions between iterations improves the overall reliability of all output soft values after several iterations.

FIG. 3 illustrates an embodiment of functional circuits for the communication receiver circuit 10, which include an iteration control processor 12 that operates as a window placement processor (WPP) configured to vary sliding window placements between iterations of the SISO algorithm. Further, the illustrated arrangement of functional circuits includes a soft input value buffer 14 for holding the input sequence, first and second sliding window buffers 16 and 18 for holding state metrics accumulated over an individual processing window by the forward and backward recursion processors 20 and 22 also included, and a soft value output buffer 24 for holding the output soft values. Note that with two recursion processors 20 and 22, forward and backward recursion within individual processing windows can be carried out simultaneously. In other embodiments, a single recursion processor first performs forward recursion and then performs backward recursion, or vice versa.

With these functional elements, or variations of them, the communication receiver circuit 10 implements the iterative SISO processing illustrated in the processing logic embodiment of FIG. 4. That is, the communication receiver circuit 10 carries out sliding-window processing of a soft value sequence in a first iteration using first window placements and in a second iteration using second window placements (Step 100). To shift the window boundaries relative to the sequence, the communication receiver circuit 10 varies the window placements between the first and second iterations (Step 102). While the first and second iterations generally comprise consecutive iterations, the teachings herein are not limited to consecutive iterations. Moreover, those skilled in the art should readily appreciate that iterative SISO processing uses fewer or greater iterations depending on the application, and window placements can be varied between each iteration in a series of iterations, or varied between fewer than all iterations in the series.

As a detailed iterative SISO processing example, FIG. 5 depicts trellis-based processing of an input soft value sequence, wherein a component trellis having known starting and ending states is traversed in one iteration using a number of sliding windows. In the illustration, each window spans W stages of the component trellis, and the overlap between successive window positions is D stages. Note that for D=0, there is no window overlap.

Those skilled in the art will readily appreciate that the trellis-based representation for the input sequence generally comprises a two-dimensional logical construct that may be implemented in hardware, software, or any combination thereof. The vertical dimension of the trellis depends on the problem complexity, e.g., the number of encoder states in a decoding problem or an exponential of the number of filter taps in an equalization problem, while the horizontal dimension—the number of trellis stages—depends on the sequence length. Note that FIG. 5 does not depict the individual trellis stages within the component trellis, but it should be understood that the component trellis comprises a potentially large plurality of successive trellis stages and that the processing window boundaries fall on given ones of those stages.

Figure 6:
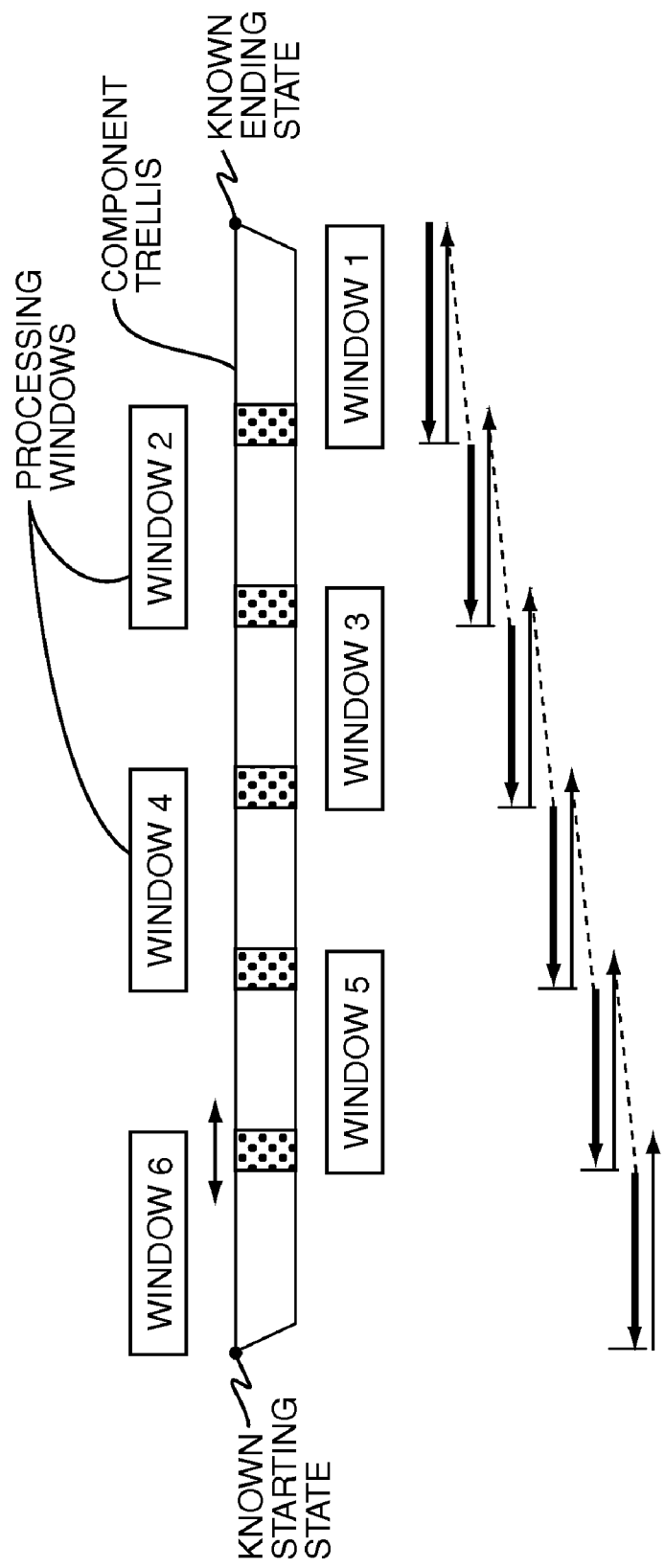

In carrying out one iteration of trellis-based SISO processing according to FIG. 5, the communication receiver 10 generates output soft values by processing the input soft values in each processing window. More particularly, the communication receiver circuit 10 performs a forward and back trellis recursion, e.g., MAP-based probability estimation, in each processing window. Note, too, that FIG. 5 illustrates a forward-first sliding window embodiment while FIG. 6 illustrates a backward-first sliding window embodiment but is otherwise identical.

Figure 8:
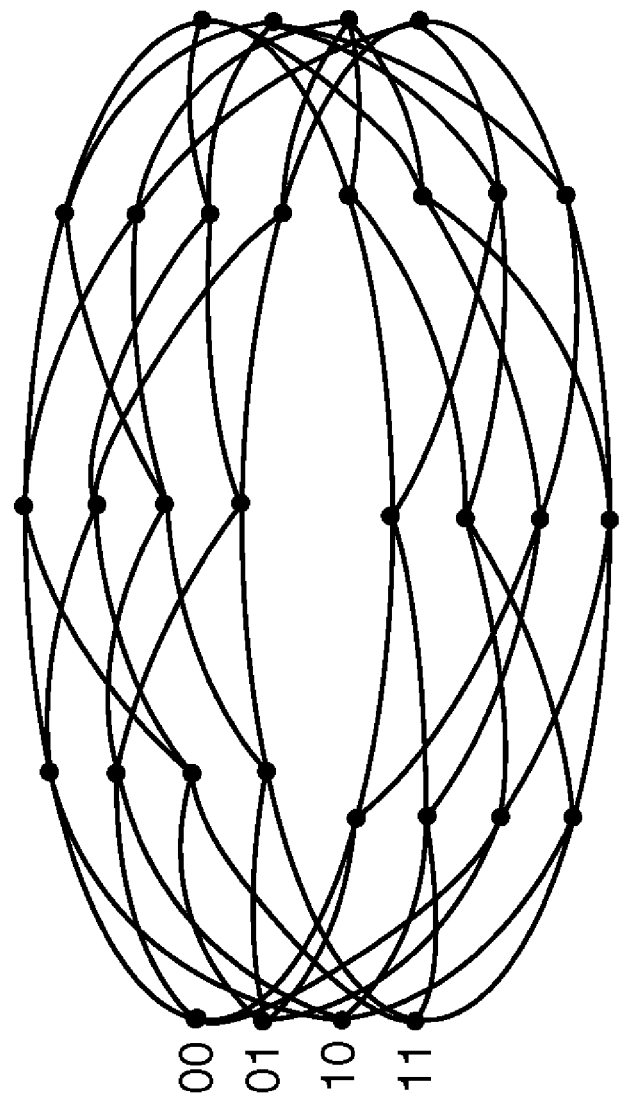
FIG. 8 is a diagram of a tailbiting MAP-based decoding trellis, for which sliding window placements taught herein may be applied.

In either case, the communication receiver circuit 10 varies the sliding window placements between iterations such that the window boundaries shift relative to the input sequence. In trellis-based representations, such shifting changes the location(s) of window boundaries relative to the trellis stages. In other words, varying the window placements between sliding window traversals of the trellis changes which trellis stages are proximate to the window boundaries from iteration to iteration. Note that such processing, i.e., varying window placements between trellis traversal iterations, also may be applied to other trellis structures/algorithms, such as the "tail-biting" MAP decoder trellis illustrated in FIG. 8.

Figure 7:
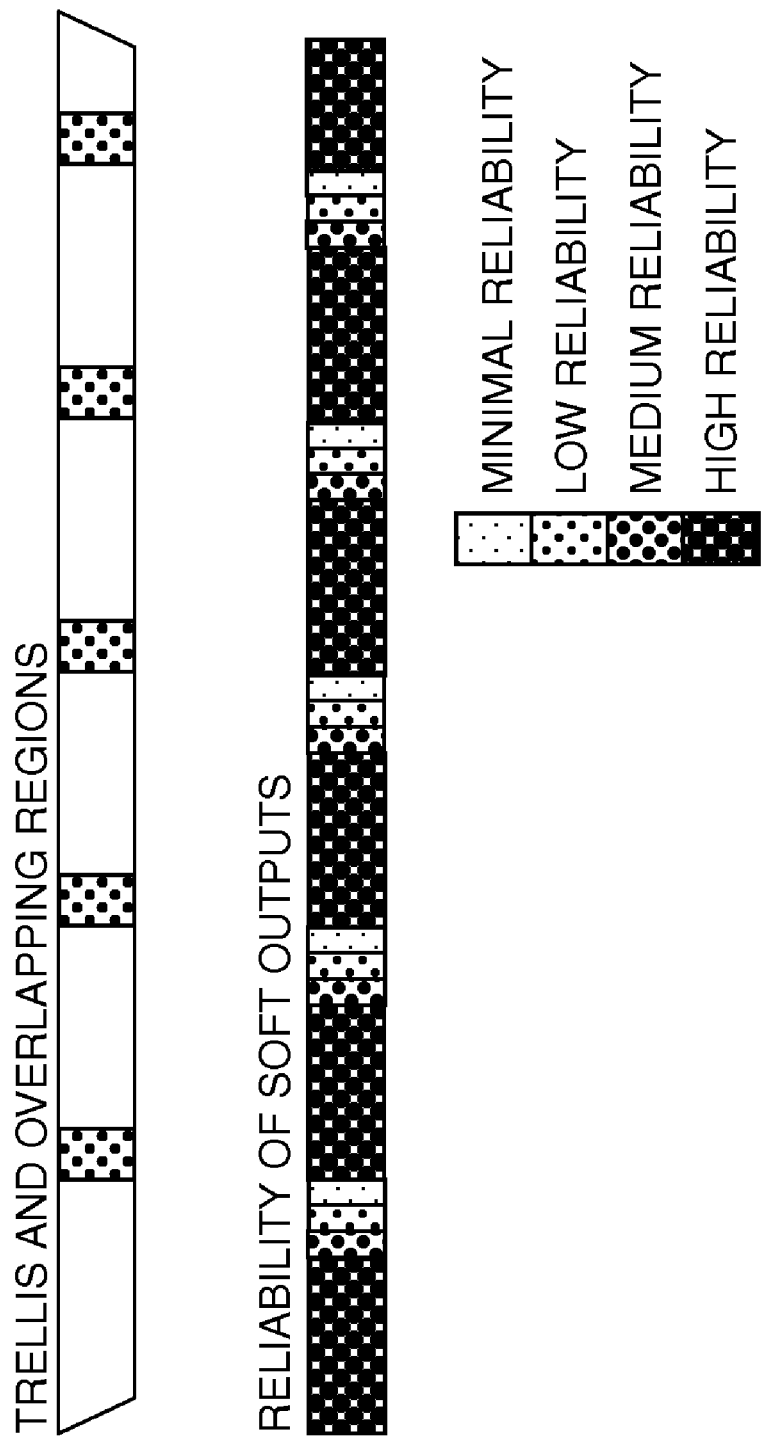
FIG. 7 is a diagram of reliability attributes of output soft values in relation to the window boundaries corresponding to the trellis-based sliding window processing of FIG. 5, for example.

FIG. 7 aids in understanding why this shifting improves the reliability of output soft values by illustrating the varying reliability attributes of trellis stages as a function of their positions relative to window boundaries. Appreciating the differing reliability attributes of trellis positions arising from the use of sliding window traversal of the trellis depends on recognizing that sliding window algorithms are made possible by the fact that the forward and backward recursions, like the Viterbi algorithm, can start "cold" at any trellis stage. The state metrics so generated are unreliable initially but would become more reliable after processing a certain number of stages for "warming up." However, since the state metrics generated during the warm-up phases are unreliable, they cannot be combined into useful soft information outputs.

Overlapping the window boundaries by D stages helps to some extent. For instance, referring back to FIG. 5, the backward recursion in Window 1 has to start with uncertainty in states. The backward state metrics can be initialized either with equal values or with certain estimates. Even with clever initialization, the state metrics generated by this backward recursion are unreliable for the initial stages and, hence, no soft information is computed during these stages. After the initial D stages, the backward state metrics are deemed acceptably reliable and soft information outputs are computed by the backward recursion of window 1. In order to generate soft outputs corresponding to these D stages, the backward recursion of Window 2 revisits them as illustrated in the figure. Because Window 2's backward recursion has already gone through many stages (of Window 2) once it reaches the D stages overlapping with Window 1, it can then compute the missing soft information outputs reliably. Similarly, Window 2 generates soft outputs for all trellis positions spanned by it, except for the D stages overlapping with Window 3, and so on.

Of course, as illustrated in FIG. 7, overlapping the sliding windows does not fully address the unreliability problem, because the regions of poor reliability are unchanging between trellis traversal iterations. In contrast, changing window placements between iterations as taught herein, with or without the use of window overlap, addresses the more fundamental problem of poor output soft values reliabilities in the vicinities of processing window boundaries, by changing the positions of those window boundaries between iterations. Thus, output soft values having relatively poor reliability attributes in one iteration owing to their proximities to window boundaries in that iteration may be expected to have improved reliability attributes in the next iteration owing to the shifted window boundaries.

More particularly, a primary teaching herein is that the window placements for component SISO processors shall vary between iterations, such as illustrated in FIGS. 9-12. (FIGS. 9-12 illustrate the first four iterations of a SISO algorithm based on trellis processing and depict one or more of the sliding window boundaries shifting between successive iterations. By varying the window placements for different iterations, the regions of signals that do not improve quickly in any particular iteration can be improved in other iterations.

On that point, varying window placements between iterations to shift window boundaries relative to the input soft value sequence comprises changing one or more window sizes and/or changing one or more offset values used to place the plurality of overlapping windows. However, because window placements are varied between iterations, an additional teaching herein is that the windows should be placed such that the overlapping regions in one iteration are far away from the overlapping regions in the immediate next iteration(s). Such variations in window placements between iterations ensures maximum reliability improvement for signals that do not improve much in the previous iteration.

In at least one embodiment taught herein, effecting window placement variations between iterations comprises applying different offsets to an initial window placement. Moreover, at least one such embodiment further comprises computing the different offsets using low-complexity modulo functions considering window size and the number of iterations. In embodiments that employ window overlap, computing the different offsets can further consider window overlap depth.

As one detailed example for a forward-first sliding window algorithm designed for T iterations, a basic window placement for a component trellis of a given number of stages can be set up as in Table 1 below:

TABLE 1

| Window index | Starting stage | Ending stage |
|---|---|---|
| 1 | 0 | W |
| 2 | W − D | (W − D) + W |
| 3 | 2(W − D) | 2(W − D) + W |
| 4 | 3(W − D) | 3(W − D) + W |
| . | . | . |
| . | . | . |
| . | . | . |

One sees from the above table that the consecutive window placements advance by (W−D) stages. The offset to this basic window placement for the t-th iteration (t=0, 1, ..., T−1) is given by the following computation:

$$\text{offset}(t) = \left[\text{round}\left(\frac{W-D}{T}\right) \times P \times t\right] \text{modulo}(W-D) \quad \text{Eq. (1)}$$

where the function round (x) returns an integer that is closest to x and the modulo operation limits the offset to the range of [0, W−D−1]. The nonzero number P in Eq. (1) controls the separation of offsets between iterations. It is desirable to select a P that is relative prime to T.

As a specific numerical example for the above embodiment of varying sliding window placement between iterations, one may assume that the number of trellis stages N=1060, the basic window width W=272, the window overlap D=16, and the number of iterations T=8. By setting P=3, it can be verified that the eight offsets for the eight iterations according to Eq. (1) are 0, 96, 192, 32, 128, 224, 64, and 160. These offsets are uniformly distributed within the window advance distance ((W−D)=256). Furthermore, the offsets result in large separations between window boundaries in consecutive iterations.

With the above numeric example in mind, two points are worth reiterating. First, the window placements represented in Table 1, and the offset value determinations calculated from Eq. (1) provide overlapping window placements for D≠0, and non-overlapping window placements for D=0. Second, the selection of an offset value for use in varying window positions between iterations of the SISO algorithm may be understood as addressing two concerns: a first concern is to have large window boundary shifts between iterations; a second concern is to avoid repeating window placements across a total number of iterations. In the above numeric example, the selection of "96" as the basic offset increment for iteration-to-iteration window placement changes results in the largest iteration-to-iteration shift than can be made, while avoiding repeated window placements across the eight total iterations.

A complete list of all windows for the eight iterations according to the current example appears in Table 2 below:

TABLE 2

| Iteration Index | Window Index | Starting Stage | Ending Stage | Number of Soft Outputs |
|---|---|---|---|---|
| 1$^{st}$ iteration | 1 | 0 | 272 | 256 |
| | 2 | 256 | 528 | 256 |
| | 3 | 512 | 784 | 256 |
| | 4 | 768 | 1040 | 256 |
| | 5 | 1024 | 1060 | 36 |
| 2$^{nd}$ iteration | 1 | 0 | 112 | 96 |
| | 2 | 96 | 368 | 256 |
| | 3 | 352 | 624 | 256 |
| | 4 | 608 | 880 | 256 |
| | 5 | 864 | 1060 | 196 |
| 3$^{rd}$ iteration | 1 | 0 | 208 | 192 |
| | 2 | 192 | 464 | 256 |
| | 3 | 448 | 720 | 256 |
| | 4 | 704 | 976 | 256 |
| | 5 | 960 | 1060 | 100 |
| 4$^{th}$ iteration | 1 | 0 | 48 | 32 |
| | 2 | 32 | 304 | 256 |
| | 3 | 288 | 560 | 256 |
| | 4 | 544 | 816 | 256 |
| | 5 | 800 | 1060 | 260 |
| 5$^{th}$ iteration | 1 | 0 | 144 | 128 |
| | 2 | 128 | 400 | 256 |
| | 3 | 384 | 656 | 256 |
| | 4 | 640 | 912 | 256 |
| | 5 | 896 | 1060 | 164 |
| 6$^{th}$ iteration | 1 | 0 | 240 | 224 |
| | 2 | 224 | 496 | 256 |
| | 3 | 480 | 752 | 256 |
| | 4 | 736 | 1008 | 256 |
| | 5 | 992 | 1060 | 68 |
| 7$^{th}$ iteration | 1 | 0 | 80 | 64 |
| | 2 | 64 | 336 | 256 |
| | 3 | 320 | 592 | 256 |
| | 4 | 576 | 848 | 256 |
| | 5 | 832 | 1060 | 228 |
| 8$^{th}$ iteration | 1 | 0 | 176 | 160 |
| | 2 | 160 | 432 | 256 |
| | 3 | 416 | 688 | 256 |
| | 4 | 672 | 944 | 256 |
| | 5 | 928 | 1060 | 132 |

As another example, this one relating to a backward-first sliding window algorithm, a right-aligned basic window placement can be set up as shown in Table 3 below:

TABLE 3

| Window index | Starting stage | Ending stage |
|---|---|---|
| 1 | N − W | N |
| 2 | N − W − (W − D) | N − (W − D) |
| 3 | N − W − 2(W − D) | N − 2(W − D) |
| 4 | N − W − 3(W − D) | N − 3(W − D) |
| . | . | . |
| . | . | . |
| . | . | . |

As a specific numerical example to illustrate the above embodiment of sliding window placement, one may assume that N=1060, W=272, D=16, and T=8. By setting P=3, one may verify that all the window placements for all eight iterations in this embodiment appear in Table 4 below:

TABLE 4

| Iteration Index | Window Index | Starting Stage | Ending Stage | Number of Soft Outputs |
|---|---|---|---|---|
| 1st iteration | 1 | 788 | 1060 | 256 |
|  | 2 | 532 | 804 | 256 |
|  | 3 | 276 | 548 | 256 |
|  | 4 | 20 | 292 | 256 |
|  | 5 | 0 | 36 | 36 |
| 2nd iteration | 1 | 884 | 1060 | 160 |
|  | 2 | 628 | 900 | 256 |
|  | 3 | 372 | 644 | 256 |
|  | 4 | 116 | 388 | 256 |
|  | 5 | 0 | 132 | 132 |
| 3rd iteration | 1 | 980 | 1060 | 64 |
|  | 2 | 724 | 996 | 256 |
|  | 3 | 468 | 740 | 256 |
|  | 4 | 212 | 484 | 256 |
|  | 5 | 0 | 228 | 228 |
| 4th iteration | 1 | 820 | 1060 | 224 |
|  | 2 | 564 | 836 | 256 |
|  | 3 | 308 | 580 | 256 |
|  | 4 | 52 | 324 | 256 |
|  | 5 | 0 | 68 | 68 |
| 5th iteration | 1 | 916 | 1060 | 128 |
|  | 2 | 660 | 932 | 256 |
|  | 3 | 404 | 676 | 256 |
|  | 4 | 148 | 420 | 256 |
|  | 5 | 0 | 164 | 164 |
| 6th iteration | 1 | 1012 | 1060 | 32 |
|  | 2 | 756 | 1028 | 256 |
|  | 3 | 500 | 772 | 256 |
|  | 4 | 244 | 516 | 256 |
|  | 5 | 0 | 260 | 260 |
| 7th iteration | 1 | 852 | 1060 | 192 |
|  | 2 | 596 | 868 | 256 |
|  | 3 | 340 | 612 | 256 |
|  | 4 | 84 | 356 | 256 |
|  | 5 | 0 | 100 | 100 |
| 8th iteration | 1 | 948 | 1060 | 96 |
|  | 2 | 692 | 964 | 256 |
|  | 3 | 436 | 708 | 256 |
|  | 4 | 180 | 452 | 256 |
|  | 5 | 0 | 196 | 196 |

Yet another example illustrates the application of sliding window placement variation as applied to a backward-first sliding window process. Beginning with a left-aligned basic window placement, assuming that N=1060, W=272, D=16, and T=8, and setting P=3, the window positions for all eight iterations are listed below in Table 5:

TABLE 5

| Iteration index | Window index | Starting Stage | Ending Stage | Number of Soft Outputs |
|---|---|---|---|---|
| 1st iteration | 1 | 1024 | 1060 | 36 |
|  | 2 | 768 | 1040 | 256 |
|  | 3 | 512 | 784 | 256 |
|  | 4 | 256 | 528 | 256 |
|  | 5 | 0 | 272 | 256 |
| 2nd iteration | 1 | 864 | 1060 | 196 |
|  | 2 | 608 | 880 | 256 |
|  | 3 | 352 | 624 | 256 |
|  | 4 | 96 | 368 | 256 |
|  | 5 | 0 | 112 | 96 |
| 3rd iteration | 1 | 960 | 1060 | 100 |
|  | 2 | 704 | 976 | 256 |
|  | 3 | 448 | 720 | 256 |
|  | 4 | 192 | 464 | 256 |
|  | 5 | 0 | 208 | 192 |
| 4th iteration | 1 | 800 | 1060 | 260 |
|  | 2 | 544 | 816 | 256 |
|  | 3 | 288 | 560 | 256 |
|  | 4 | 32 | 304 | 256 |
|  | 5 | 0 | 48 | 32 |
| 5th iteration | 1 | 896 | 1060 | 164 |
|  | 2 | 640 | 912 | 256 |
|  | 3 | 384 | 656 | 256 |
|  | 4 | 128 | 400 | 256 |
|  | 5 | 0 | 144 | 128 |
| 6th iteration | 1 | 992 | 1060 | 68 |
|  | 2 | 736 | 1008 | 256 |
|  | 3 | 480 | 752 | 256 |
|  | 4 | 224 | 496 | 256 |
|  | 5 | 0 | 240 | 224 |
| 7th iteration | 1 | 832 | 1060 | 228 |
|  | 2 | 576 | 848 | 256 |
|  | 3 | 320 | 592 | 256 |
|  | 4 | 64 | 336 | 256 |
|  | 5 | 0 | 80 | 64 |
| 8th iteration | 1 | 928 | 1060 | 132 |
|  | 2 | 672 | 944 | 256 |
|  | 3 | 416 | 688 | 256 |
|  | 4 | 160 | 432 | 256 |
|  | 5 | 0 | 176 | 160 |

Figure 13:
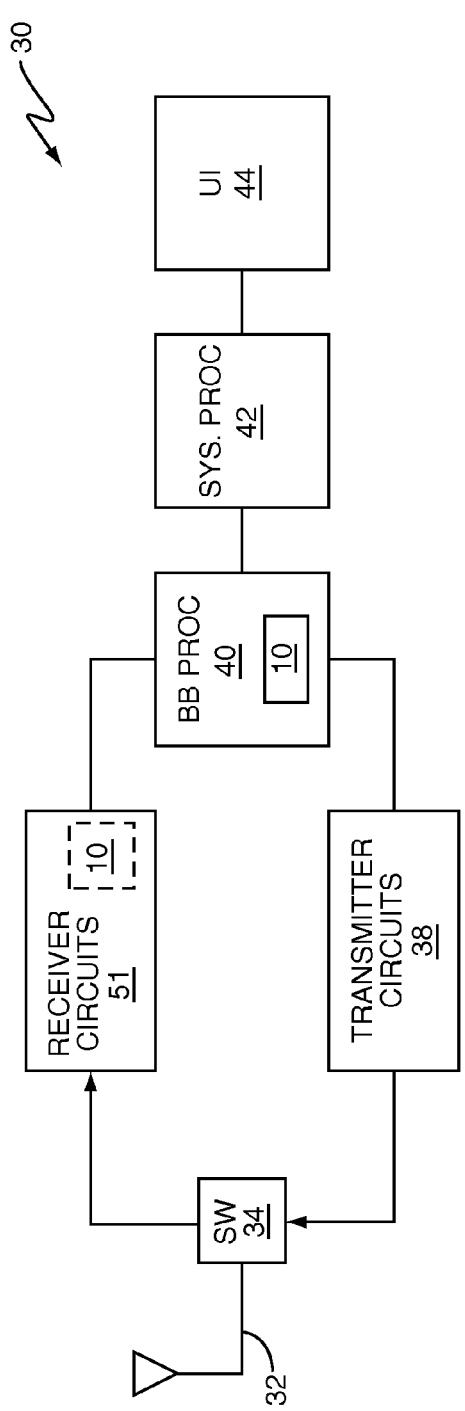
FIG. 13 is a block diagram of one embodiment of a wireless communication device that includes a communication receiver circuit configured to vary sliding window placements between iterations of a SISO algorithm.

Turning from window placement examples, to device and system implementations, those skilled in the art will appreciate that the sliding window placement teachings presented herein offer the opportunity to improve communication receiver performance in a variety of applications, such as in wireless communication network base stations and/or their associated user equipment (UE). For example, FIG. 13 illustrates a wireless communication device 30, which includes an embodiment of the communication receiver circuit 10 introduced in FIG. 1.

The wireless communication device 30 comprises, for example, a cellular radiotelephone or other mobile terminal, a Portable Digital Assistant (PDA), a pager, a laptop/palmtop computer or wireless network adapter therein, or essentially any other type of device having a wireless communication receiver therein. In at least one particular embodiment, the wireless communication device 30 comprises a communication terminal configured according to Universal Mobile Telecommunication System (UMTS) standards and supports radio communications in accordance with the Wideband CDMA (WCDMA) standards.

In at least one embodiment, the communication receiver circuit 10 comprises all or part of an integrated circuit chip set included within the wireless communication device 30. Additionally, the wireless communication device 30 includes, in a non-limiting architectural example, a transmit/receive antenna 32, a switch (or duplexer) 34, receiver and transmitter circuits 36 and 38, a baseband processor 40, a system processor 42, and a user interface 44, which, depending on the device's intended use, may include a display, keypad, and audio input/output devices.

In at least one embodiment, the receiver circuits 36 comprise front-end circuits providing amplification and digitization of received signals, and the baseband processor provides digital baseband processing of the digitized received signal samples. In such cases, the communication receiver circuit 10 may be integrated into the baseband processor 40 in the form of hardware, software, firmware, micro-coded logic circuits, etc. (Note that, in many cases, the baseband processor 40 also performs transmit processing functions and generates a transmit signal for amplification and transmission by the transmitter circuits 38.) In other embodiments, baseband processing may be segregated between receive and transmit functions, and the communication receiver circuit 10 may therefore be subsumed within the block of receiver circuits 36.

Figure 14:
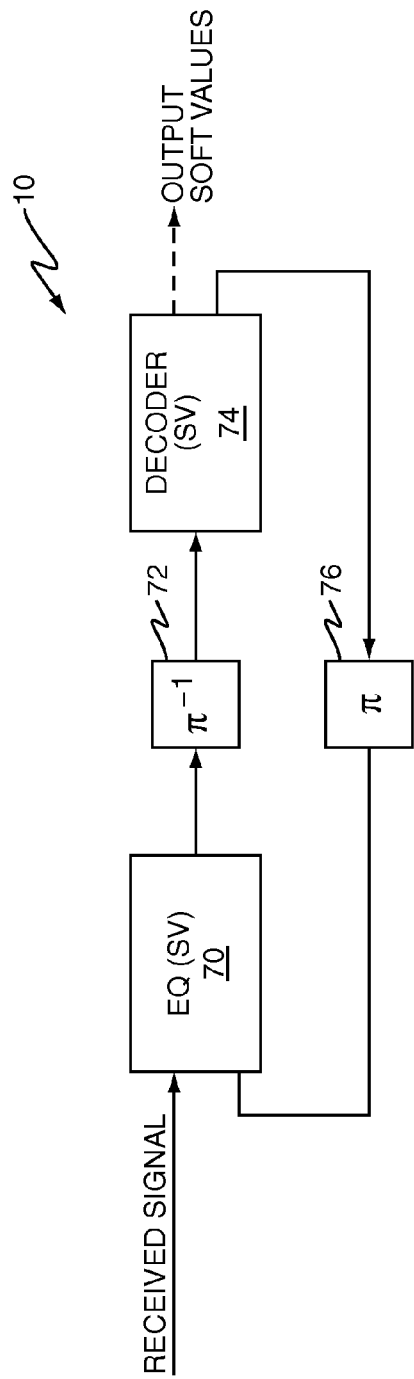
FIG. 14 is an equalization circuit embodiment of the communication receiver circuit that may be included in the wireless communication device of FIG. 13.

In general the architectural details for implementing the shifting window placement method taught herein will vary as needed or desired, in accordance with the particular application at hand. FIG. 14 offers one example application, wherein the communication receiver circuit 10 is configured as a soft equalization and decoder circuit comprising an equalizer 70, a de-interleaver 72 (with the de-interleaving function denoted as "$\pi^{-1}$"), a soft-value decoder 74, and an interleaver 76 (with the interleaving function denoted as "$\pi$"). In operation, the decoder 74 operates as an iterative SISO processor and uses sliding-window processing as taught herein to generate output soft values from the equalized and de-interleaved input soft values provided to it by the de-interleaver 72.

In more detail, in the first iteration, the equalizer 70 equalizes a sequence of input soft values without benefit of any a priori information. The equalized soft values pass through de-interleaver 72 and feed into the decoder 74, which uses first sliding window placements to process the input soft values. Extrinsic information generated in this first iteration feeds back through the interleaver 76 as a priori information input to the equalizer 70 for its next iteration, which in turn generates "improved" soft values for input to the decoder 74. This processing repeats a desired or defined number of iterations, with the decoder 74 varying window placements between iterations as taught herein.

Figure 15:
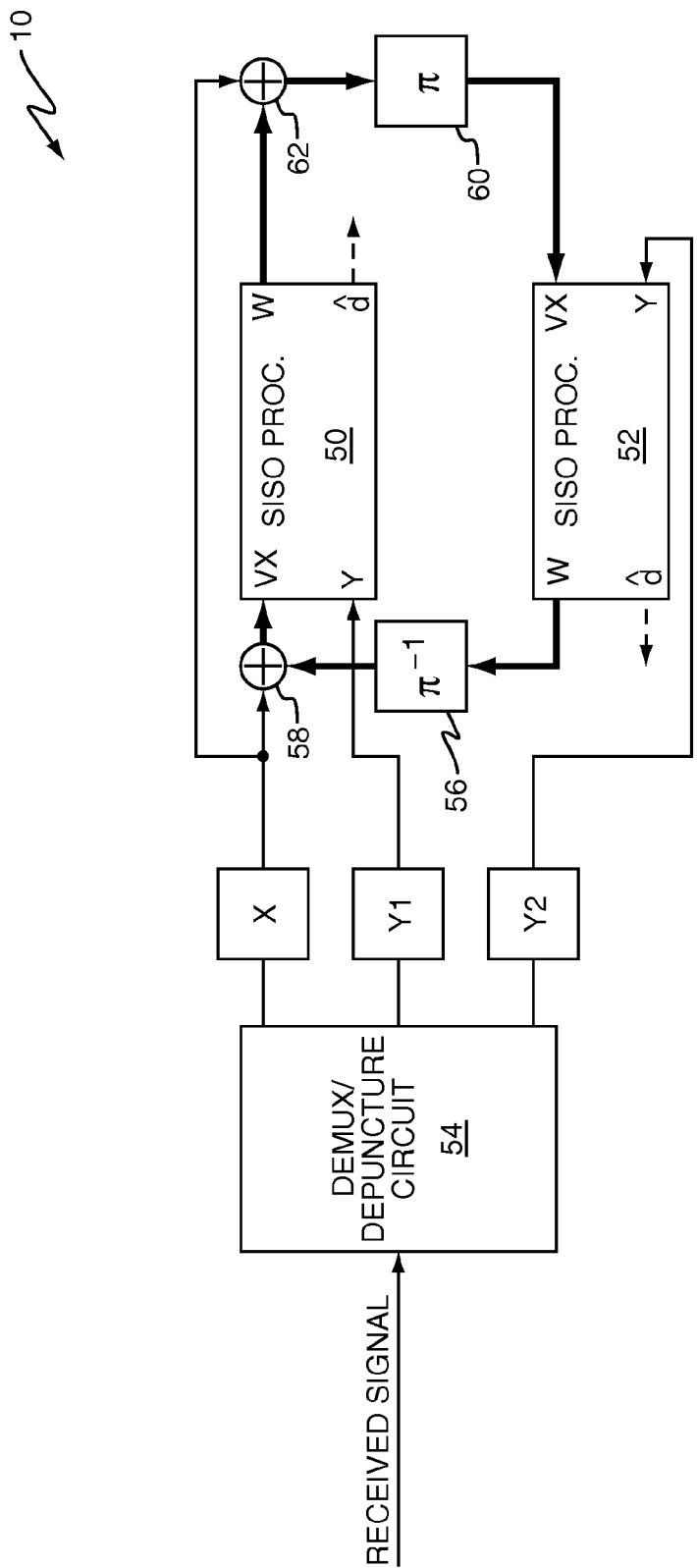
FIG. 15 is a turbo decoder embodiment of the communication receiver circuit that may be included in the wireless communication device of FIG. 13.

FIG. 15 illustrates a turbo decoder embodiment of the communication receiver circuit 10. Generally, with turbo decoding, there is one decoder for each elementary encoder. Each such decoder estimates the extrinsic information of each data bit, and the APP's generated by one decoder serve as a priori information by the other decoder. Decoding continues for a set number of iterations, with performance gains diminishing with each repeated iteration.

With such operation in mind, the illustrated embodiment of the communication receiver circuit 10 includes first and second SISO processors 50 and 52, and further includes or is associated with a de-multiplexing/de-puncturing circuit 54, a de-interleaving circuit 56 and associated summing circuit 58, and an interleaving circuit 60 and associated summing circuit 62. In operation, received signal soft values are de-multiplexed and de-punctured by the de-multiplexing/de-puncturing circuit 54, which outputs substreams X, Y1, and Y2, corresponding to bit soft values (X) and convolutionally encoded bit soft values (Y1 and Y2).

In operation, the SISO processors 50 and 52 operate as iterative SISO decoders, one or both of which are configured to vary sliding window placements between iterations. In at least one embodiment, the SISO processors 50 and 52 comprise two concatenated MAP or log-MAP decoders, which iteratively decode the coded input. The number of iterations may be varied according to channel conditions or another performance metric, for example, and each SISO processor 50 and 52 may include its own window placement processor, or a window placement processor (not explicitly shown) may set window placements for both processors to effect varying window placements between iterations. In either case, the SISO processors 50 and 52 can use the same varying window placements, or, if both SISO processors 50 and 52 use varying window placements, each can vary window placements independently of the other.

Figure 16:
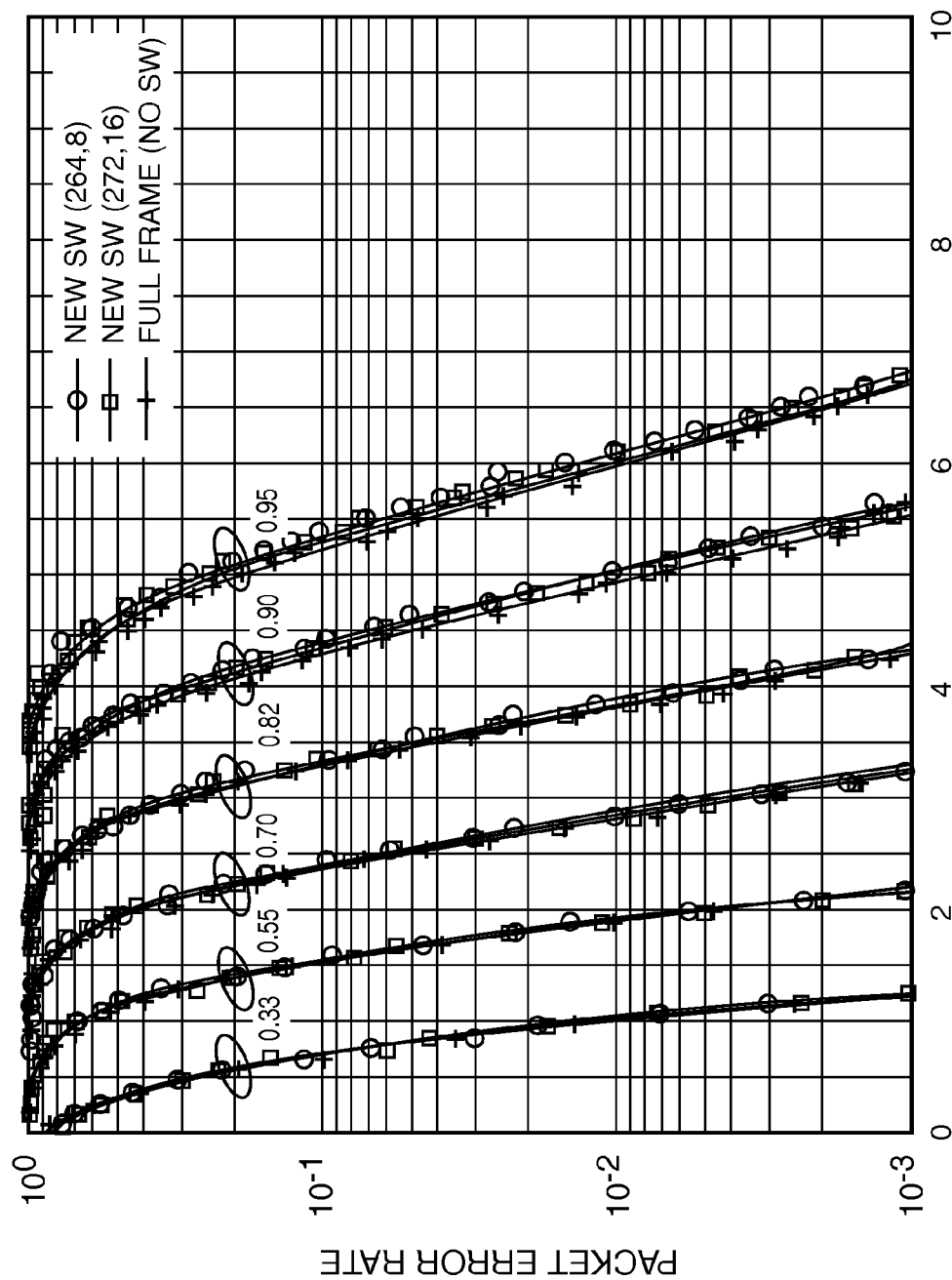
Figure 17:
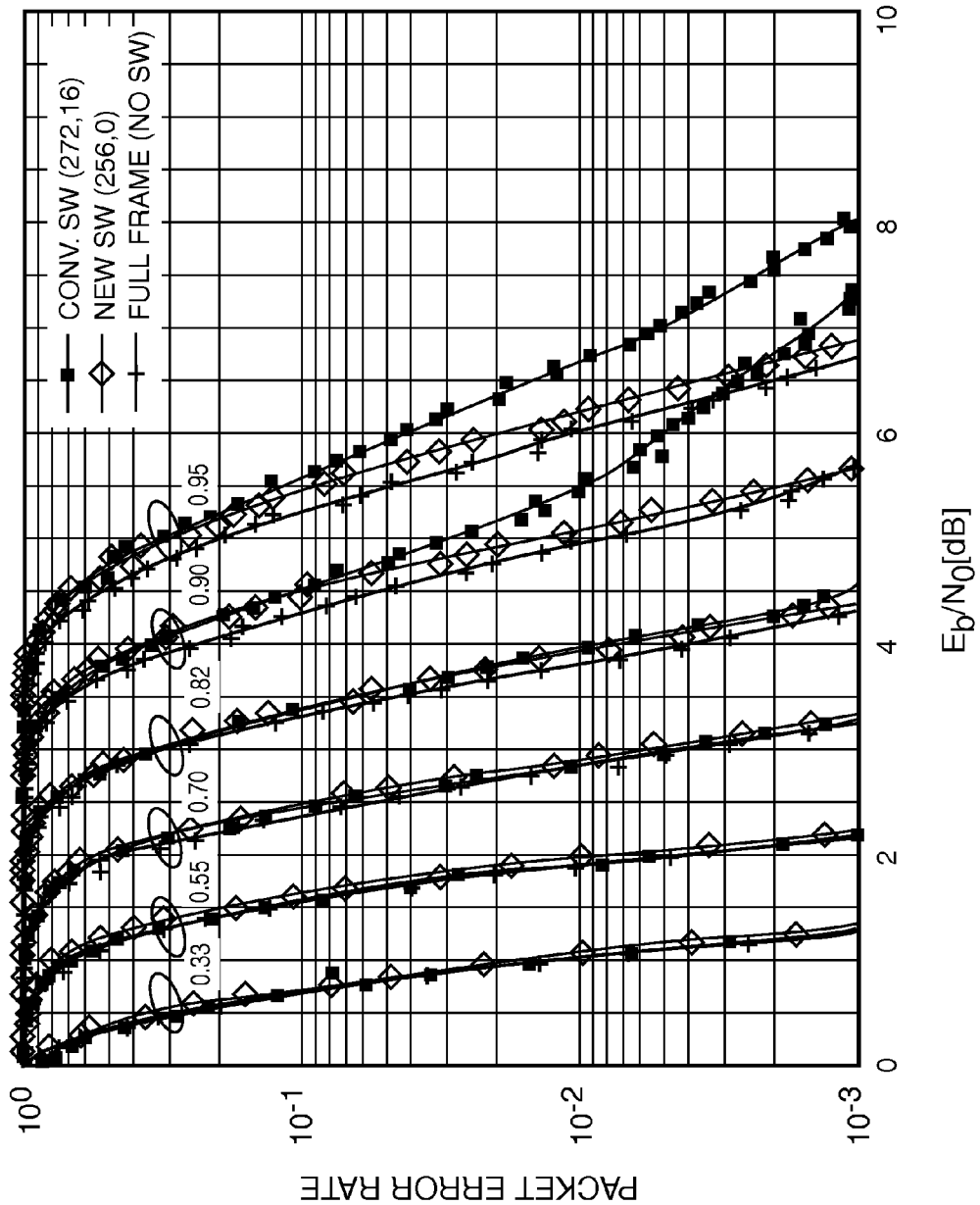
Figure 18:
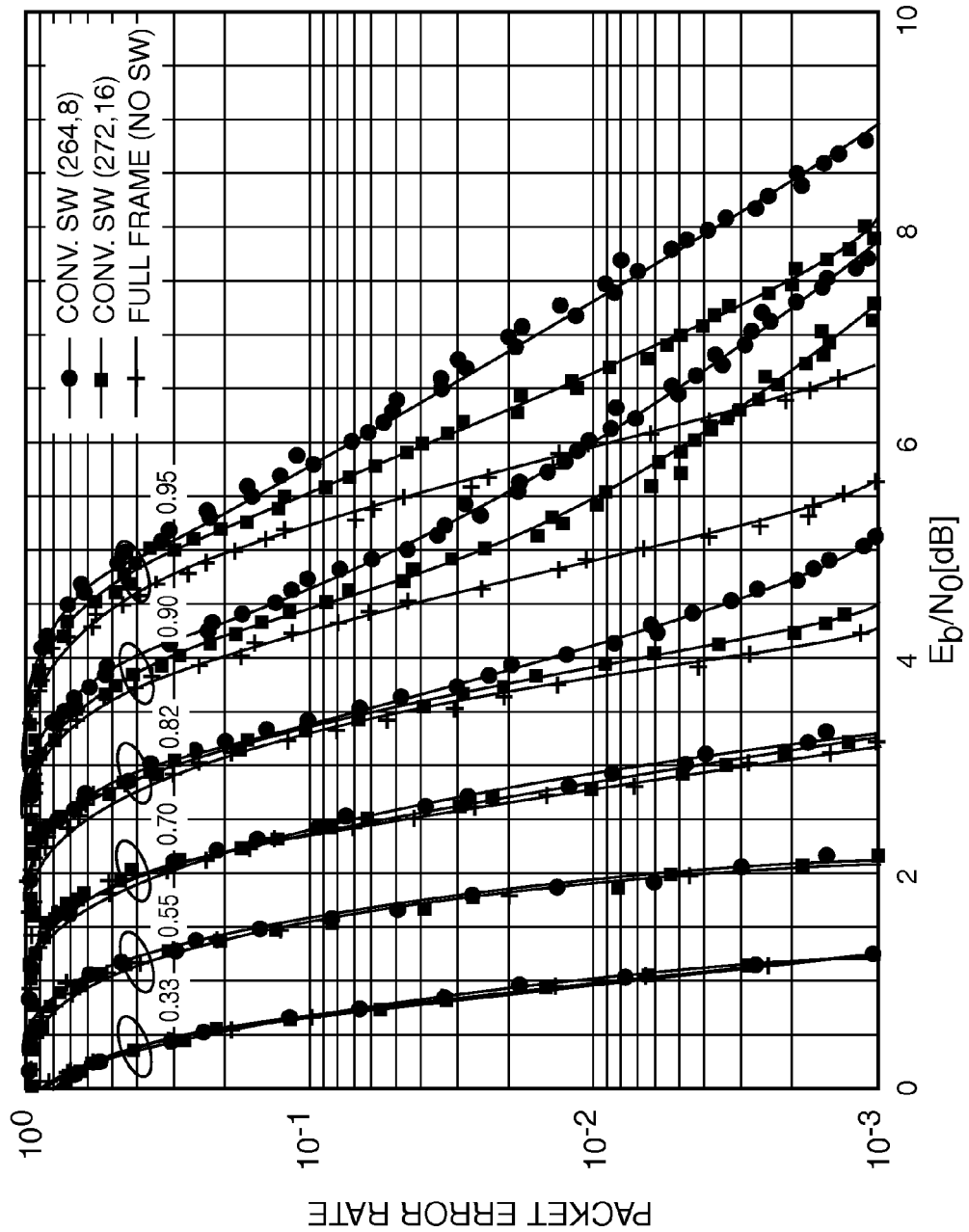
FIGS. 18, 21, and 24 represent comparative performance for corresponding decoding operations performed without varying sliding window placements between decoding iterations.
Figure 19:
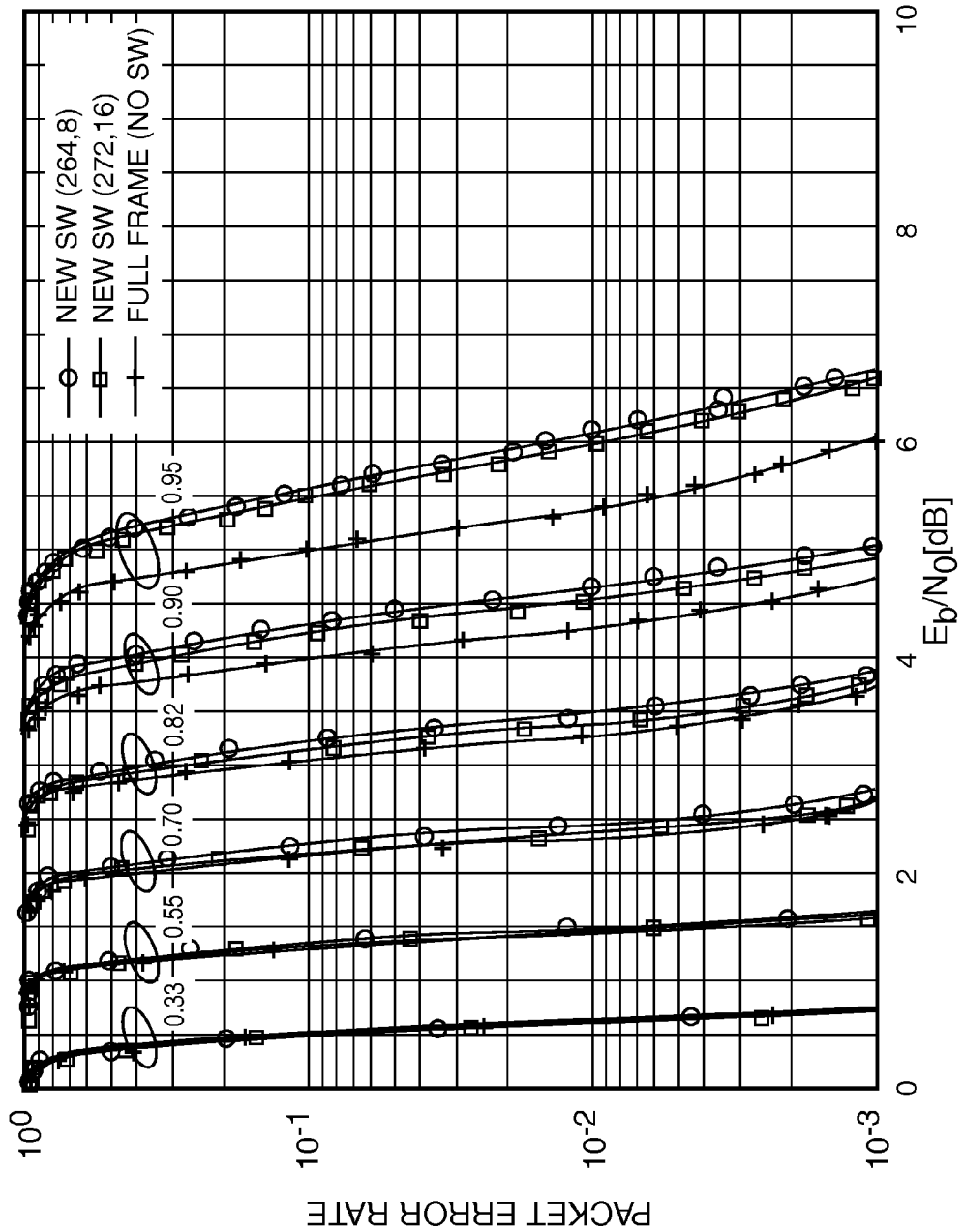
Figure 20:
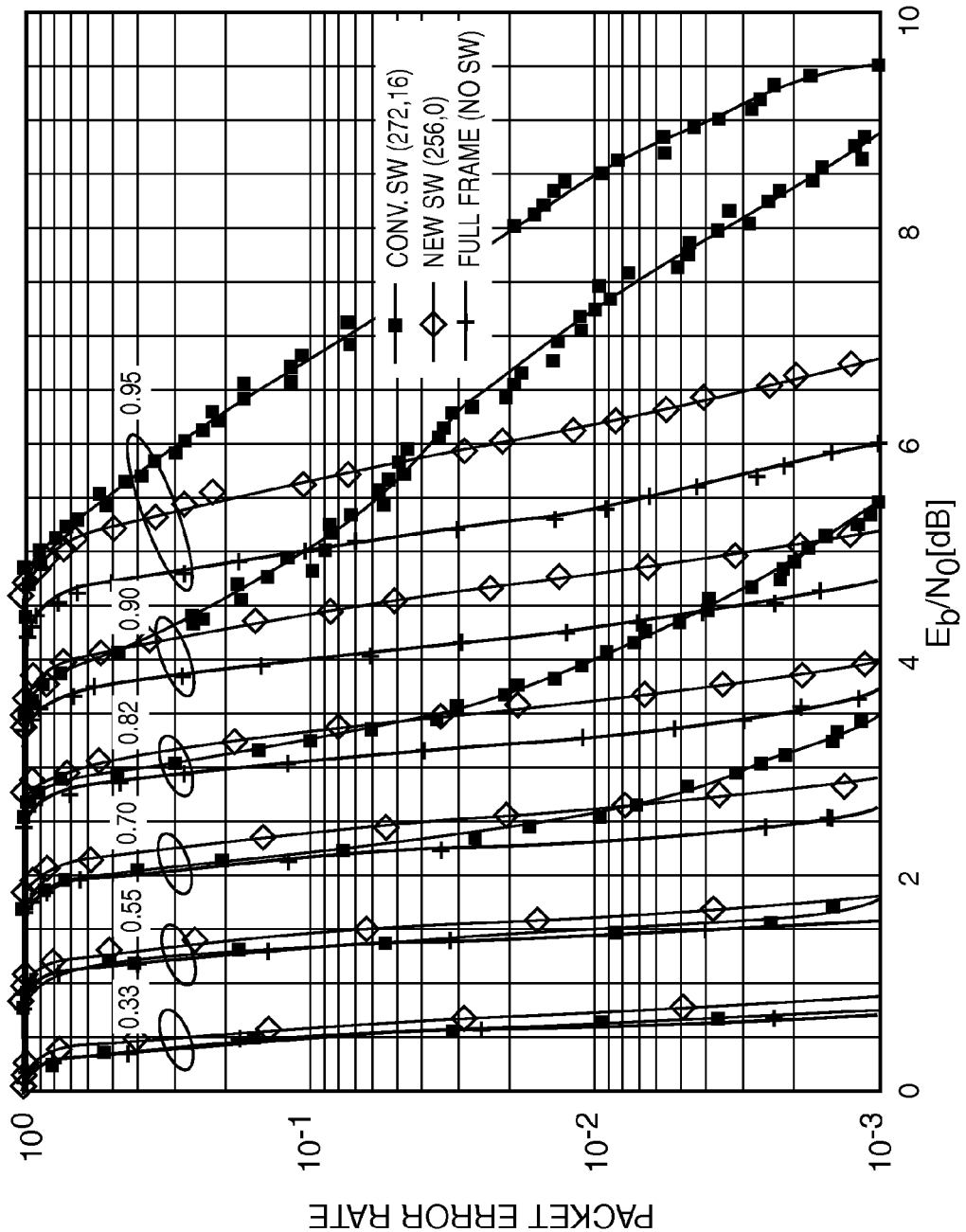
Figure 21:
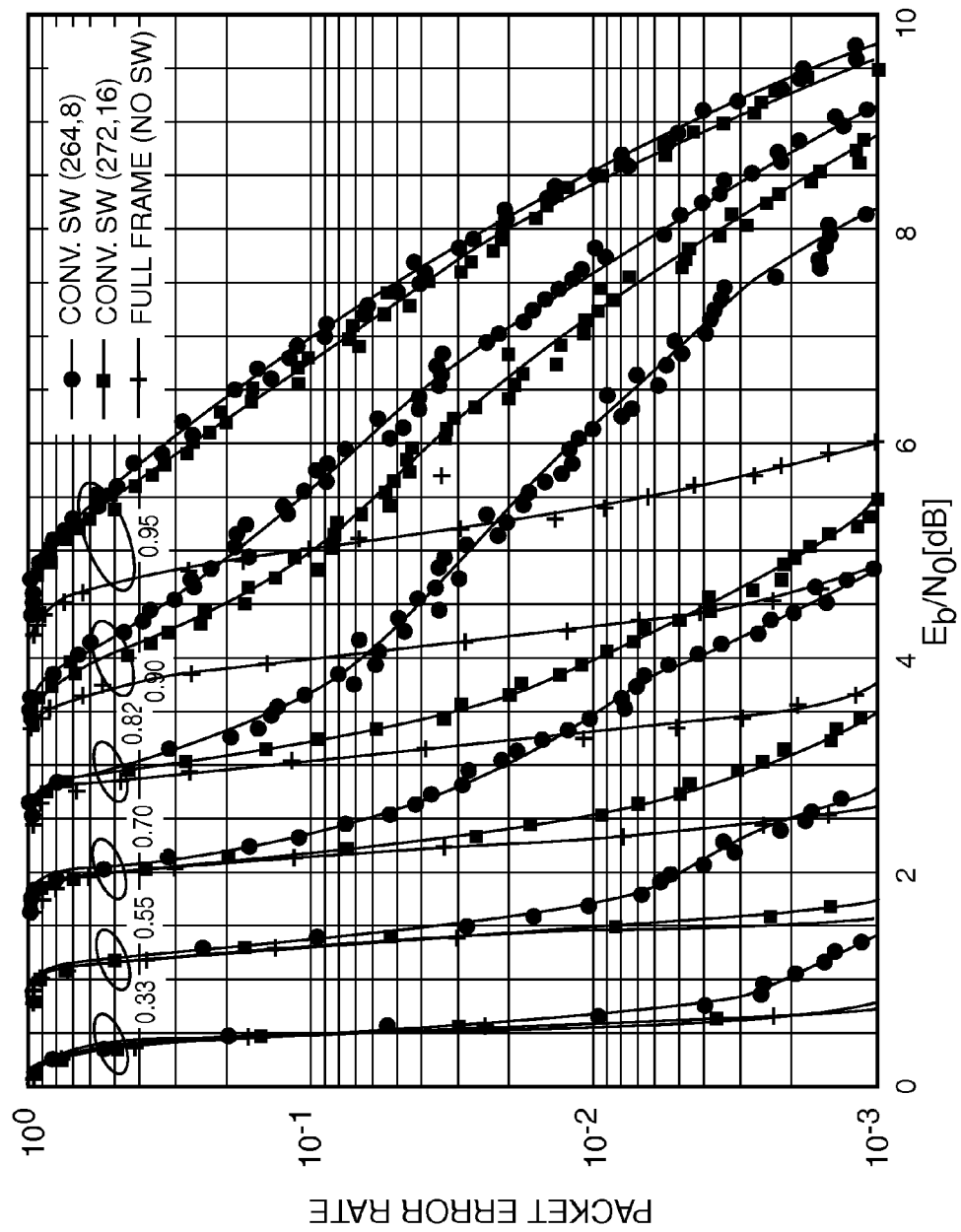
Figure 22:
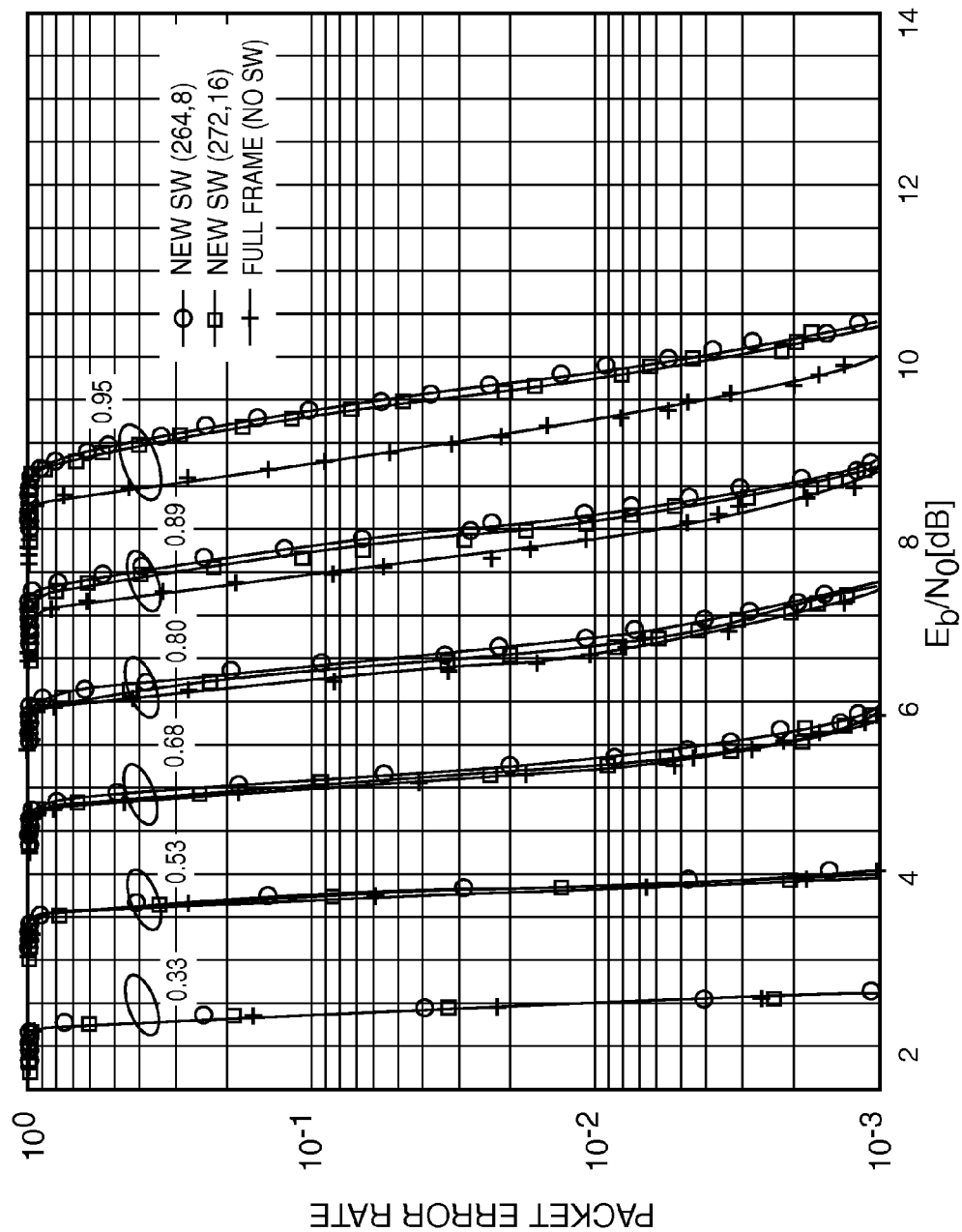
Figure 23:
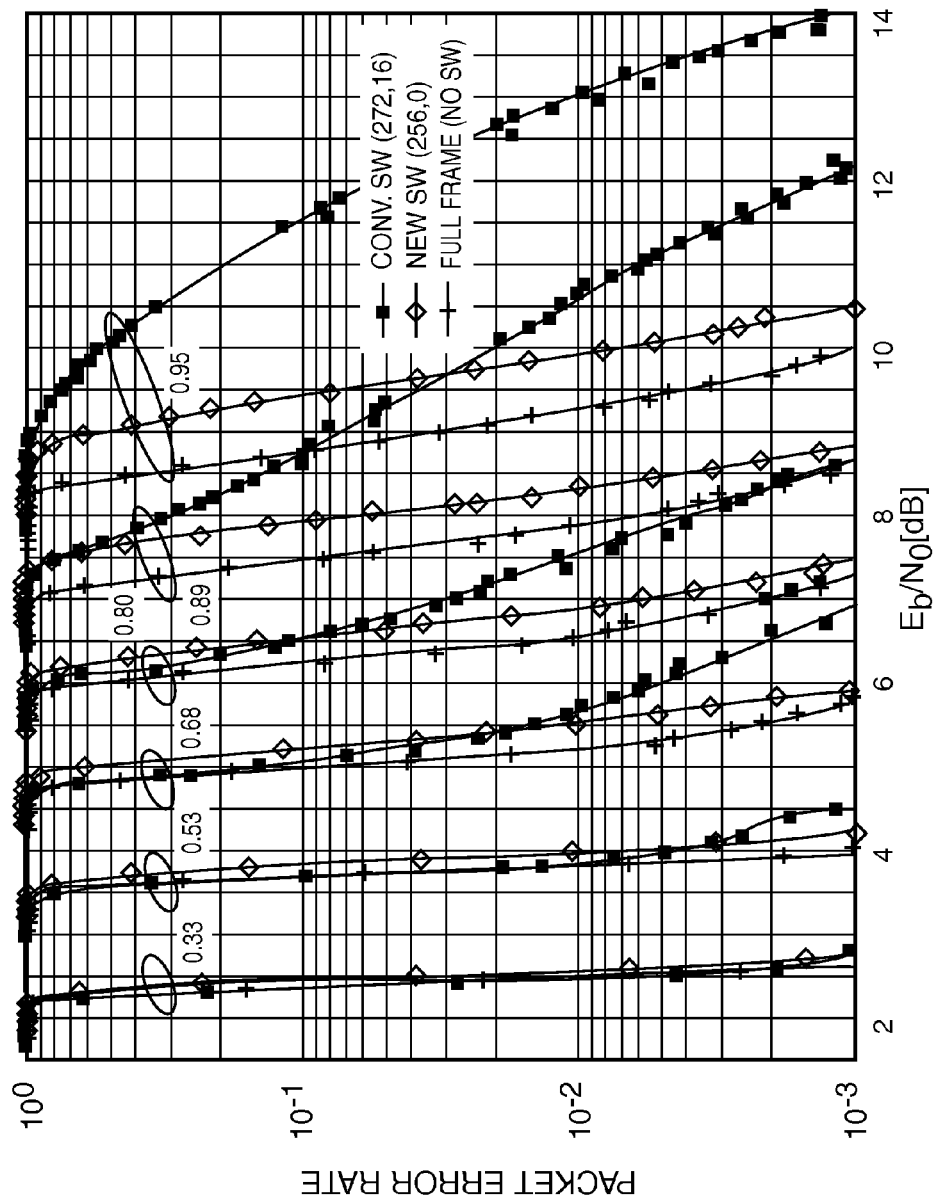
Figure 24:
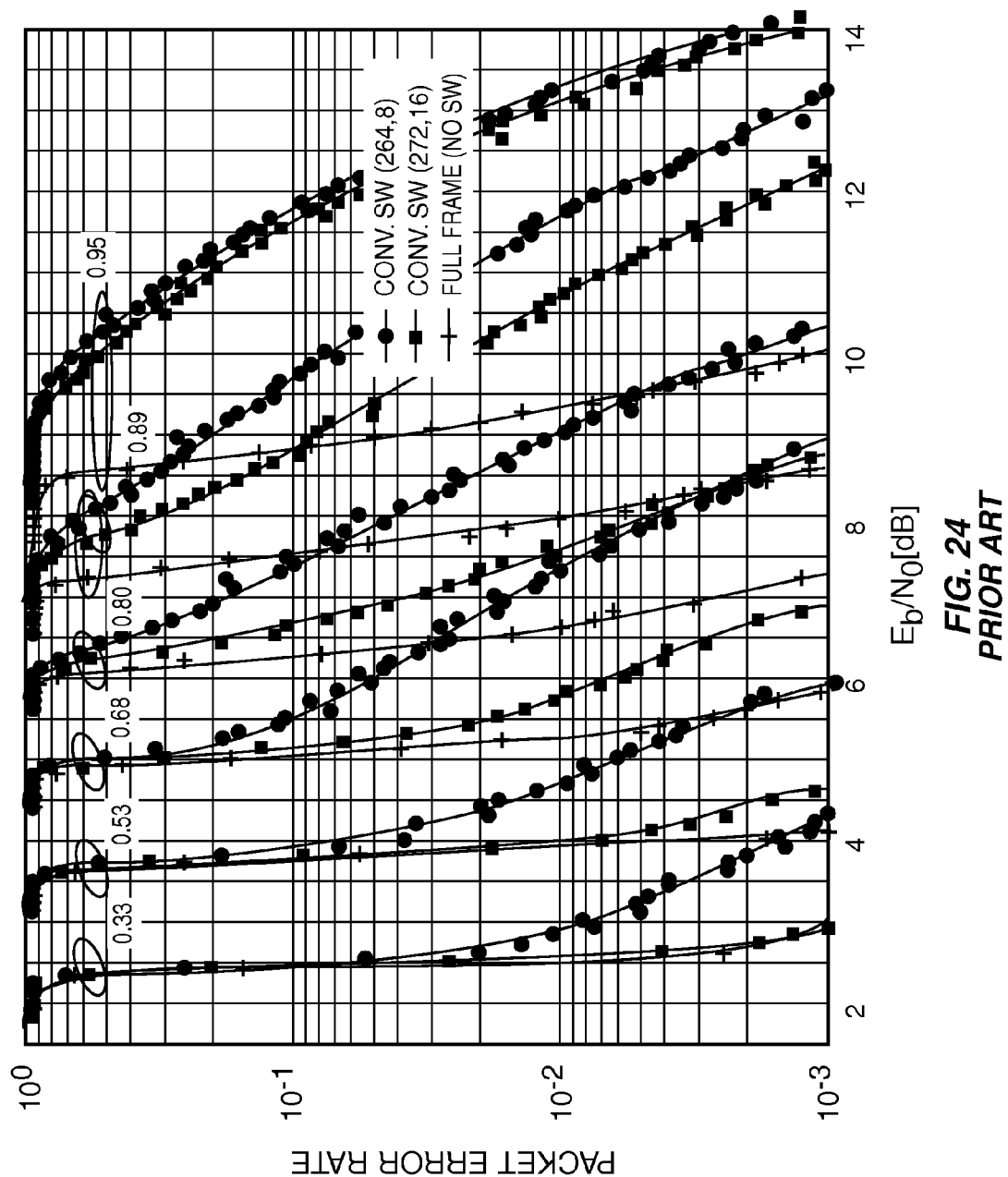

FIGS. 16, 17, 19, 20, 22, and 23 illustrate turbo decoding performance examples gained by varying sliding window placements between decoding iterations, as taught herein. Each diagram illustrates packet error rates and for all cases, T=8 iterations are used with P=3. FIGS. 18, 21, and 24 provide respective corresponding illustrations of the lower decoding performance when overlapping sliding windows are used without varying sliding window placements between decoding iterations. FIGS. 16, 17, 19, 20, 22, and 23 demonstrate that varying sliding window placements between iterations removes the "error floor" and yields performance on par with "full-frame" decoding, wherein the input sequence is decoded all of a piece without subdividing it into processing windows.

In more detail, FIG. 16 illustrates decoding performance for coded QPSK with a packet size of 640 bits using sliding window placements that vary between decoding iterations, for six coding rates r=[0.33, 0.55, 0.70, 0.82, 0.90, 0.95]. One set of sliding window decoders is designed with W=264 and D=8, while another is designed with W=272 and D=16. FIG. 17 uses the same coding rates, but it illustrates performance for a sliding window decoder configured for W=272, D=16, and performance for a sliding window decoder configured for W=256, D=0 (non-overlapping sliding windows). FIG. 17 also illustrates full frame (no sliding window) performance for reference. To further illustrate the decoding performance gains obtained by varying sliding window placements between iterations, FIG. 18 illustrates decoding performance in the same modulation and coding context as FIGS. 16 and 17, but with fixed sliding window placements used between decoding iterations.

Similarly, FIG. 19 illustrates decoding performance for coded QPSK with a packet size of 5120 bits using sliding window placements that vary between decoding iterations, for six coding rates r=[0.33, 0.55, 0.70, 0.82, 0.90, 0.95]. One set of sliding window decoders is designed with W=264 and D=8, while another is designed with W=272 and D=16. FIG. 20 uses the same modulation and coding rates, but it illustrates performance for a sliding window decoder configured for W=272, D=16, and performance for a sliding window decoder configured for W=256, D=0 (non-overlapping sliding windows). FIG. 20 also illustrates full frame (no sliding window) performance for reference. To further illustrate the decoding performance gains obtained by varying sliding window placements between iterations, FIG. 21 illustrates decoding performance in the same modulation and coding rate context as FIGS. 19 and 20, but with fixed sliding window placements used between decoding iterations.

Finally, FIG. 22 illustrates decoding performance for coded 16 QAM with packet size of 25570 bits using sliding window placements that vary between decoding iterations, for six coding rates r=[0.33, 0.53, 0.68, 0.80, 0.89, 0.95]. On the transmit side, each packet is first segmented into five blocks of length 5114 bits each, and each segment is turbo encoded. On the receiver side, each segment is decoded independently, and the packet is received correctly only if all five segments are decoded correctly. In the same modulation and coding context, FIG. 23 illustrates decoding performance for non-overlapping windows (W=256, D=0). For reference to decoding performance in the absence of varying sliding window placements, FIG. 24 illustrates decoding performance in the same modulation and coding rate context as FIGS. 22 and 23, but with fixed sliding window placements used between decoding iterations.

While varying sliding window placements between decoding iterations offers demonstrable and significant performance improvements in the above turbo decoding context, those skilled in the art will appreciate its applicability to a wide variety of SISO processing, such as in Generalized Rake finger or other sequence combining. In general, varying window placements can be used to perform iterative SISO processing in, for example: iterative decoders for serial & parallel turbo codes; iterative soft demodulation and decoding processors; iterative equalization and decoding processors; iterative multi-user detection and decoding processors; and iterative multiple-input-multiple-output (MIMO) demodulation and decoding processors.

Broadly, the present invention teaches varying sliding window placements between iterations of an iterative SISO algorithm. For example, in trellis-based processing wherein the trellis is traversed in one iteration by performing MAP-based forward and backward recursion in subsections of the trellis covered by each of one or more overlapping windows, the present invention shifts one or more of those window boundaries between iterations, such that the reliability attributes of the trellis positions change between iterations. As such, the present invention is not limited by the foregoing description and accompanying drawings. Instead, the present invention is limited only by the claims and their legal equivalents.

What is claimed is:

1. A method of generating output soft values from a sequence of input soft values in a soft-input-soft-output (SISO) algorithm, the method comprising:
    in each of two or more iterations of the SISO algorithm, subdividing the sequence into a plurality of windows and processing the input soft values in each window; and
    varying window placements between iterations to shift window boundaries relative to the sequence.

2. The method of claim 1, wherein varying window placements between iterations to shift window boundaries relative to the sequence comprises changing one or more window sizes.

3. The method of claim 1, wherein varying window placements between iterations to shift window boundaries relative to the sequence comprises changing one or more offset values used to place the plurality of windows.

4. The method of claim 3, further comprising determining the one or more offset values in dependence on a total number of iterations.

5. The method of claim 1, wherein varying window placements between iterations to shift window boundaries relative to the sequence comprises applying different offsets to an initial window placement.

6. The method of claim 5, further comprising computing the different offsets using low-complexity modulo functions considering window size and number of iterations.

7. The method of claim 6, comprising computing the different offsets further considering window overlap depth.

8. The method of claim 5, further comprising computing the different offsets to maximize window boundary shifts between iterations, while not repeating window placements across a total number of iterations.

9. The method of claim 1, wherein processing the input soft values in each window comprises performing forward and backward trellis recursion in each window.

10. The method of claim 1, further comprising applying the method in a turbo decoder comprising communicatively coupled first and second decoders, such that one or both decoders use varying window placements between turbo decoding iterations.

11. The method of claim 1, wherein varying window placements between iterations to shift window boundaries relative to the sequence comprises shifting the window boundaries relative to the sequence such that output soft values having relatively poor reliability attributes in one iteration have improved reliability attributes in a next iteration.

12. A method of processing a soft value sequence according to an iterative soft-input-soft-output (SISO) algorithm, the method comprising:
    carrying out sliding-window processing of the soft value sequence in a first iteration using first window placements and in a second iteration using second window placements; and
    varying the window placements between the first and second iterations.

13. The method of claim 12, wherein varying the window placements between the first and second iterations comprises changing offset values used to position the sliding windows relative to the soft value sequence such that window boundaries shift relative to the soft value sequence between the first and second iterations.

14. The method of claim 12, wherein carrying out sliding-window processing of the soft value sequence in a first iteration using first window placements and in a second iteration using second window placements comprises, in each of the first and second iterations, performing forward and backward recursion processing of soft values in the soft value sequence covered by each sliding window.

15. The method of claim 12, wherein carrying out sliding-window processing of the soft value sequence in a first iteration using first window placements and in a second iteration using second window placements comprises, in each of the first and second iterations, carrying out trellis-based processing of the soft value sequence based on sliding-window traversal of the trellis.

16. The method of claim 12, wherein varying the window placements between the first and second iterations comprises varying the window placements to shift window boundaries relative to the sequence such that output soft values having relatively poor reliability attributes in one iteration have improved reliability attributes in a next iteration.

17. A communication receiver circuit comprising:
    one or more processing circuits configured to generate output soft values from a sequence of input soft values in a soft-input-soft-output (SISO) algorithm by, in each of two or more iterations of the SISO algorithm, subdividing the sequence into a plurality of windows and processing the input soft values in each window; and
    wherein the one or more processing circuits vary window placements between iterations to shift window boundaries relative to the sequence.

18. The communication receiver circuit of claim 17, wherein the communication receiver circuit is configured to vary window placements between iterations by changing one or more window sizes.

19. The communication receiver circuit of claim 17, wherein the communication receiver circuit is configured to vary window placements between iterations by changing one or more offset values used to place the plurality of windows.

20. The communication receiver circuit of claim 19, wherein the communication receiver circuit is configured to determine the one or more offset values used to place the plurality of windows in dependence on a total number of iterations.

21. The communication receiver circuit of claim 17, wherein the communication receiver circuit is configured to vary window placements between iterations by applying different offsets to an initial window placement.

22. The communication receiver circuit of claim 21, wherein the communication receiver circuit is further configured to compute the different offsets using low-complexity modulo functions considering window size and number of iterations.

23. The communication receiver of claim 22, wherein the communication receiver circuit is configured to compute the different offsets in further consideration of window overlap depth.

24. The communication receiver of claim 21, wherein the communication receiver circuit is configured to compute the different offsets to maximize window boundary shifts between iterations, while not repeating window placements across a total number of iterations.

25. The communication receiver circuit of claim 17, wherein the communication receiver circuit is configured to process the input soft values in each window by performing forward and backward trellis recursion in each window.

26. The communication receiver circuit of claim 17, wherein the communication receiver circuit comprises at least a portion of a turbo decoding circuit, and wherein the one or more processors comprise communicatively coupled first and second decoders, such that one or both decoders use varying window placements between turbo decoding iterations.

27. The communication receiver circuit of claim 17, wherein the communication receiver circuit comprises one of an iterative decoder for parallel or serial turbo codes, an iterative soft demodulation and decoding processor, an iterative equalization and decoding processor, an iterative multi-user detection and decoding processor, or an iterative multiple-input-multiple-output demodulation and decoding processor.

28. The communication receiver circuit of claim 17, wherein the one or more processing circuits are configured to vary window placements between iterations to shift window boundaries relative to the sequence such that output soft values having relatively poor reliability attributes in one iteration have improved reliability attributes in a next iteration.

29. The communication receiver circuit of claim 17, wherein said circuit is part of a wireless communication device.

* * * * *

UNITED STATES PATENT AND TRADEMARK OFFICE
CERTIFICATE OF CORRECTION

| | | |
|---|---|---|
| PATENT NO. | : 7,810,018 B2 | Page 1 of 1 |
| APPLICATION NO. | : 11/553767 | |
| DATED | : October 5, 2010 | |
| INVENTOR(S) | : Cheng | |

It is certified that error appears in the above-identified patent and that said Letters Patent is hereby corrected as shown below:

In Column 15, Line 1, in Claim 23, delete "receiver" and insert -- receiver circuit --, therefor.

In Column 15, Line 5, in Claim 24, delete "receiver" and insert -- receiver circuit --, therefor.

Signed and Sealed this
Eighteenth Day of January, 2011

David J. Kappos
*Director of the United States Patent and Trademark Office*